United States Patent [19]
Taniguchi et al.

[11] Patent Number: 6,134,161
[45] Date of Patent: Oct. 17, 2000

[54] TEST CIRCUIT AND TEST METHOD FOR SEMICONDUCTOR MEMORY

[75] Inventors: Kazuo Taniguchi; Atsushi Tamura; Ken Matsumoto, all of Kanagawa, Japan

[73] Assignee: Sony Corporation, Japan

[21] Appl. No.: 08/942,298

[22] Filed: Oct. 1, 1997

[30] Foreign Application Priority Data

Oct. 11, 1996 [JP] Japan ................................. 8-269469

[51] Int. Cl.[7] ............................................... G11C 7/00
[52] U.S. Cl. ................................. 365/201; 365/230.08
[58] Field of Search ............................. 365/201, 230.08

[56] References Cited

U.S. PATENT DOCUMENTS 5,511,029  4/1996  Sawada et al. .......................... 365/201
5,579,272  11/1996  Uchida .................................... 365/201

*Primary Examiner*—David Nelms
*Assistant Examiner*—M. Tran
*Attorney, Agent, or Firm*—Ronald P. Kananen; Rader, Fishman & Grau

[57] ABSTRACT

A logic IC including an embedded memory is provided with a test circuit therein which allows the embedded memory to be tested by using only three additional external pins of the logic IC for test purposes without regard to the bit count of a unit in which data is written into or read out from the embedded memory. In addition, the embedded memory can be tested by adopting a method that requires a period of testing time shorter than the related art one.

2 Claims, 2 Drawing Sheets

TEST CIRCUIT AND TEST METHOD FOR SEMICONDUCTOR MEMORY

BACKGROUND OF THE INVENTION

1. Field of the Invention

The present invention relates to a logic IC, more particularly, to a logic IC with a memory embedded therein.

2. Description of the Related Art

There are some logic ICs each with an embedded memory wherein the memory is never directly accessed by another device external to the logic IC during its use in operations for directly writing and reading out data to and from the memory. It is necessary upon the completion of a process to manufacture such a logic IC into a product to test the logic circuit employed therein as well as the embedded memory.

A test of a logic circuit of an IC can be carried out by supplying an arbitrary signal to the logic circuit through a pin of the IC and observing a signal output by the logic circuit also through a pin of the IC.

As for a test of a memory embedded in the IC, signals such as address, control and data signals are supplied to the memory from a source external to the IC and a data signal output by the memory is fetched by an observing device also external to the IC. Since providing pins to the IC only for memory-test purposes will limit the enhancement of the degree of integration of the IC, however, pins for the logic circuit are also used for supplying the signals such as address, control and data signals and for observing the data signal in a memory test.

Speaking concretely, a selector is provided. When testing the embedded memory, the selector is put in a state that allows the memory to be accessed through the selector. In this way, the embedded memory can be tested. In normal usage, the selector is put in a state that prevents the embedded memory from being accessed from a device external to the IC. In this state, the external pins of the IC are virtually connected to the logic circuit only.

With such a scheme, some pins used for testing the embedded memory are shared by the logic circuit. As a result, the number of pins dedicated for test purposes only is relatively small.

Depending upon the number of pins for the logic circuit, however, test data generally can not be supplied and observed in some cases unless pins dedicated for test purposes are provided. For example, eight input pins and eight output pins are provided for test purposes involving eight-bit data. In this case, a total of 16 test pins which are required only during a test are not used at all in a normal operation. In the case of 16, 32 or 64-bit test data, a total of 32, 64 or 128 test pins which are not used at all in a normal operation need to be provided for test purposes only. In addition, in order to respond to a demand for an enhanced graphic performance for three-dimensional graphic applications for example, the IC is required to go multi-bit, giving rise to a problem that the number of test pins increases due to the multi-bit configuration, a problem that can no longer be overlooked.

SUMMARY OF THE INVENTION

It is thus an object of the present invention to provide a test circuit and a test method for testing a memory embedded in a logic IC which allow the number of pins for memory test purposes to be reduced and the length of the time it takes to complete a test of the embedded memory to be decreased.

A logic IC including an embedded memory provided by the present invention comprises, that is, an input pin for memory-test purposes;

a switching pin for memory-test purposes;

an output pin for memory-test purposes;

as many selectors as a plurality of bits of the input of said embedded memory's memory array provided between a logic circuit and said input with by associating said selectors with said bits on a one-to-one basis wherein each of said selectors inputs a signal from said logic circuit and a signal from said input pin for memory-test purposes and forwards either said signal from said logic circuit or said signal from said input pin for memory-test purposes which is specified by a switching signal supplied to said selector from said switching pin for memory-test purposes to said memory array; and a data compressing circuit for memory-test purposes for receiving a read-back signal with a plurality of bits output by said memory array and converting said read-back signal into a one-bit output signal to be output to said output pin for memory-test purposes.

As a result, in a logic IC having an embedded memory provided by the present invention, a memory test can be carried out by using a data compressing circuit which requires only three pins dedicated for memory-test purposes, that is, a memory-test switching-signal pin, a memory-test input pin and a memory-test output pin. The number of pins dedicated for memory-test purposes does not depend on the bit count of the logic IC. In addition, since the memory test is carried out by compression of bits using the data compressing circuit, the length of the time it takes to complete the memory test is short in comparison with a case in which each bit is tested.

BRIEF DESCRIPTION OF THE DRAWINGS

A preferred embodiment of the present invention will be described by referring to the following drawings wherein, FIG. 1 a circuit diagram showing a logic IC including an embedded memory as implemented by an embodiment of the present invention.

DETAILED DESCRIPTION OF THE PREFERRED EMBODIMENT

The present invention will become more apparent from a study of the following detailed description of a preferred embodiment with reference to the accompanying diagrams.

Figure 1:
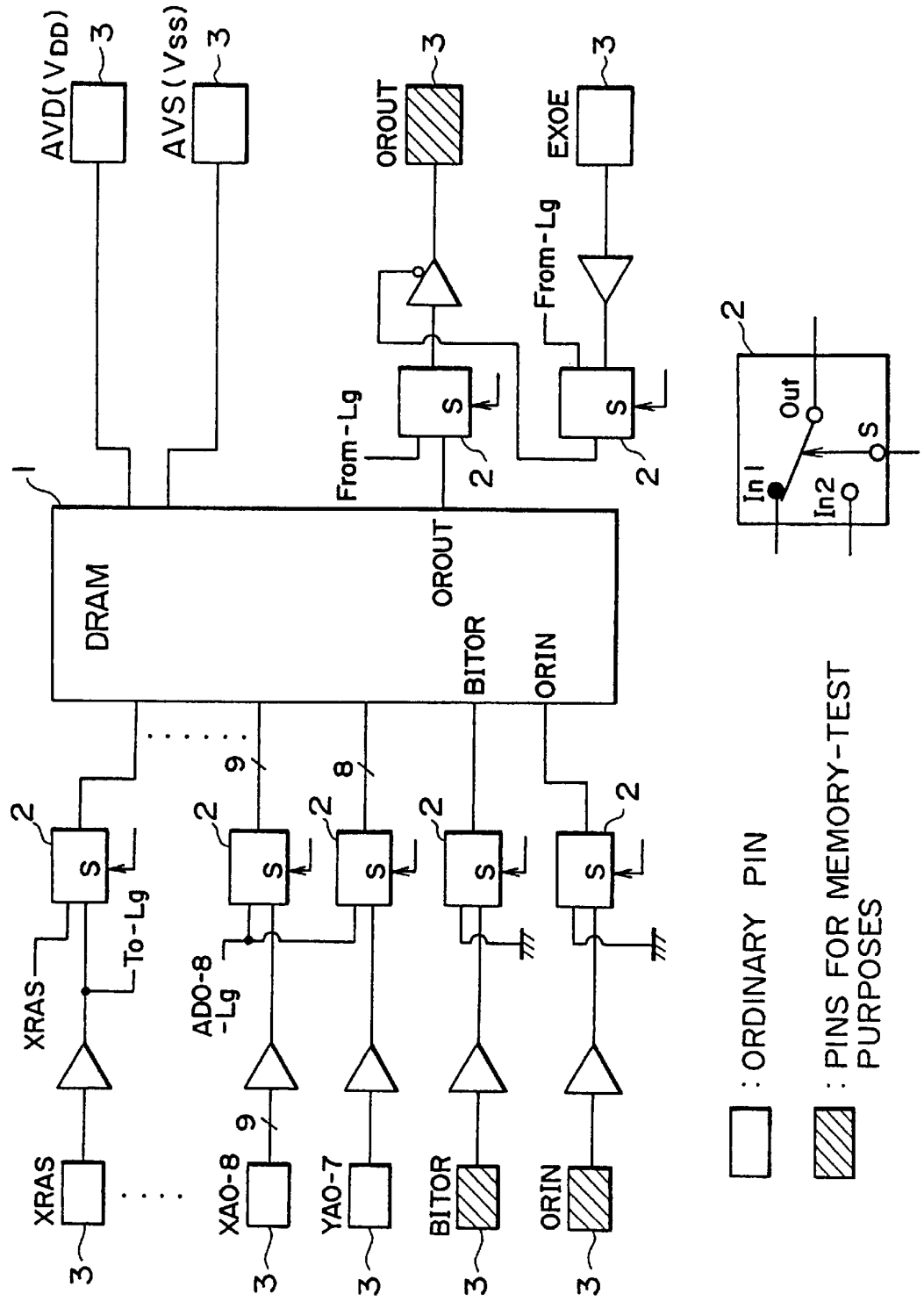
Figure 2:
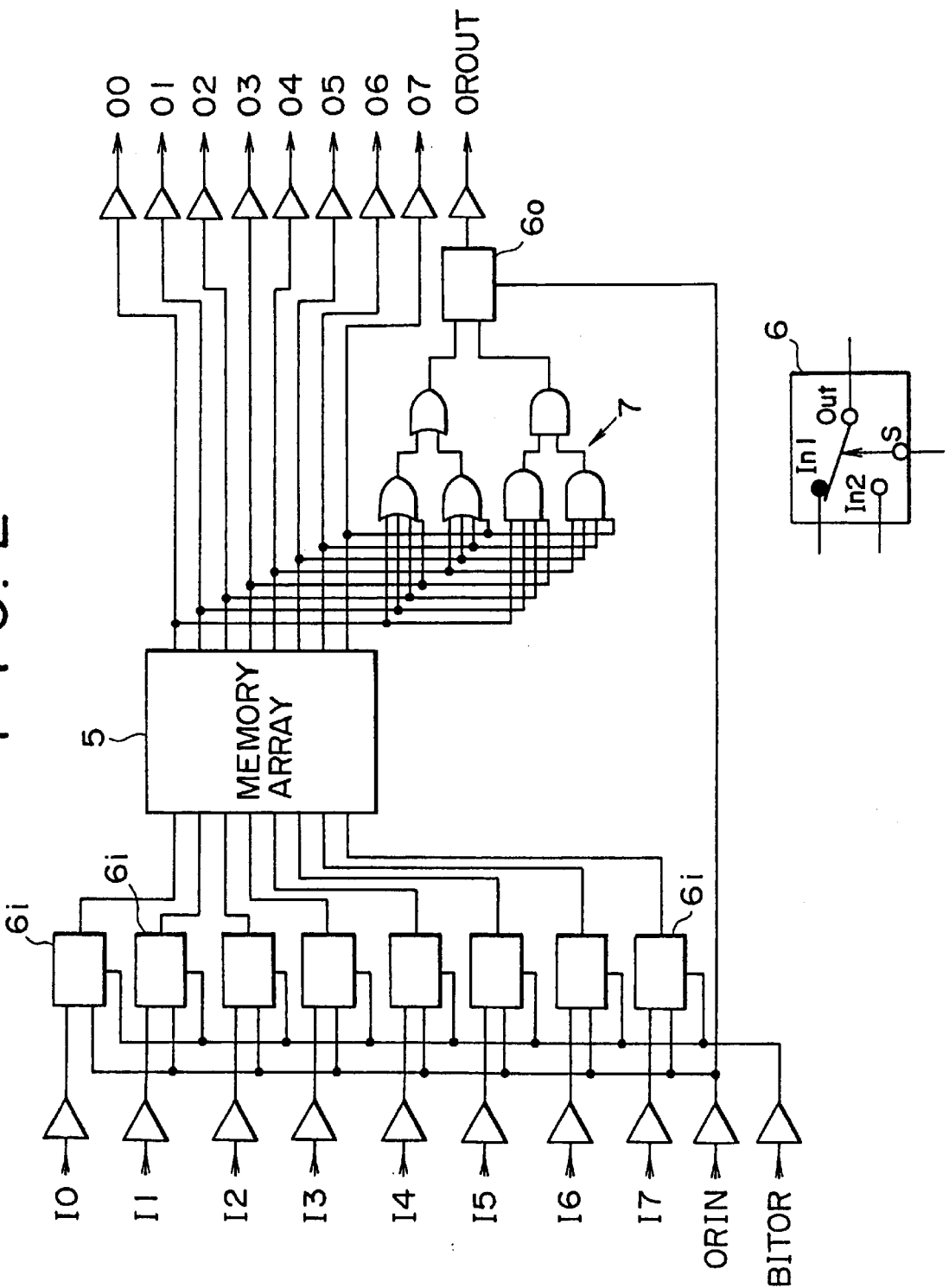
FIG. 2 circuit diagram showing principal components of the logic IC including an embedded memory as implemented by the embodiment of the present invention.

FIG. 1 is a circuit diagram showing a logic IC including an embedded memory as implemented by an embodiment of the present invention and FIG. 2 is a circuit diagram showing principal components of the logic IC shown in FIG. 1.

In the figures, reference numeral 1 denotes a DRAM (Dynamic Random-Access Memory) and reference numerals 2—2 are each a selector. Each of the selectors 2 has two input pins In1 and In2, a switching pin S as well as an output pin Out. The input pins In1 and In2 which is selected by a select signal provided to the selector 2 through the switching pin S is connected to the output pin Out. Reference numerals 3—3 each denote a pin (external pin) of the IC used for testing the DRAM 1 shown in FIG. 1. Pins which are connected to a logic circuit but not used for testing the DRAM 1 are not shown in the figure. In addition, some pins used for testing the DRAM 1 as well are also not shown in the figure.

During a test, the input pin In2 of each selector 2 is selected by the select signal from the DRAM 1 so that a signal supplied to the selector 2 through the input pin In2 is forwarded to the output pin Out. In this state, signals such as a data signal ORIN, control signals, access signals and a selector switching signal BITOR supplied through the pins 3 are forwarded by the selectors 2 to the DRAM 1. In addition, a one-bit output data signal OROUT is output from one of the pins 3 through one of the selectors 2.

In a native operation of the IC, it is the input pin In1 of the selector 2 that is connected to the output pin Out. As a result, the DRAM 1 is connected to the logic circuit, which is not shown in the figure. In this state, pins used for inputs and outputs of a variety of signals during a test are virtually disconnected from the DRAM 1, and serve as pins connected to the logic circuit.

In the present IC, by using the selectors 2, control and access signals can supplied to the DRAM 1 connected to the logic circuit not shown in the figure during a test through the pins 3 which are provided originally as pins for the logic circuit in a native operation. As a result, only a BITOR pin 3, an ORIN pin 3 and an OR pin 3 need to be added to the IC as pins dedicated for test purposes.

The DRAM 1 has a circuit configuration shown in FIG. 2. In the figure, reference numeral 5 denotes a memory array of the DRAM 1 and reference numerals 6i—6i are each a selector provided on the data-input side of the memory array 5. As many selectors 6i as bits are provided. In this embodiment, the number of bits is eight. Reference numeral 60 denotes a selector provided on the data-output side of the memory array 5. The selectors 6i and the selector 6o each has two input pins In1 and In2, an output pin Out as well as a switching pin S. One of the input pins In1 and In2 which is selected by a select signal provided to the selector 2 through the switching pin S is connected to the output pin Out.

The input pin In1 of each of the selectors 6i on the data-input side is connected to the logic circuit which is not shown in the figure. On the other hand, the input pin In2 is connected to an input node ORIN for memory-test purposes. It should be noted that the input node ORIN is the same as the ORIN pin of the DRAM 1 shown in FIG. 1. The switching pin S of each of the selectors 6i is connected to a switching node BITOR for memory-test purposes. (By the same token, the switching node BITOR is the same as the BITOR pin of the DRAM 1 shown in FIG. 1.) The select signal supplied through the switching node BITOR causes the input pin In2 to be connected to the output pin Out during a test and the input pin In1 to be connected to the output pin Out during a native operation.

A data compressing circuit 7 for memory-test purposes is provided between the selector 6o on the data-output side and the memory array 5. As shown in FIG. 2, the data compressing circuit 7 comprises a plurality of logical-sum (OR) gates for generating a logical sum of all bits of data output by the memory array 5 and a plurality of logical-product (AND) gates for generating a logical product of all the bits. As described above, the number of bits in the present embodiment is eight. The logical sum and the logical product generated by the data compressing circuit 7 are supplied to the input pins In1 and In2 of the selector 6o respectively. The signal appearing at the memory-test input node ORIN described is supplied to the switching pin S of the selector 6o.

In a memory test, a select signal from the switching node BITOR causes the second input pin In2 of each selector 6i to be connected to the output pin Out thereof while a memory-test data signal from the memory-test input node ORIN is supplied to each input pin In2. In this way, an input signal comprising a plurality of bits is used as test data and a result of the test is compressed into a bit which is output through an output node OROUT. (By the same token, the output node OROUT is the same as the OROUT pin of the DRAM 1 shown in FIG. 1.) A judgment as to whether the memory is good or bad is based on a judgment as to whether or not the value of the one output bit, which depends upon the input signal, is equal to the expected value of the output bit. Since the memory-test data signal supplied from the memory-test input node ORIN is either 0 or 1, it is needless to say that a test for writing bits of all zeros or all ones can of course be carried out. It should be noted, however, that by changing the way to access the memory array 5 through variation of the address data represented by XAO-8 and YAO-7 shown in FIG. 1 and by changing the memory-test data, complicated data such as a check card pattern can be stored in the memory array 5. Then, a bit-count compressing test using such complicated data can be carried out.

As described above, according to a logic IC having an embedded memory provided by the present invention, a memory test can be carried out by using the data compressing circuit 7 which requires only three pins dedicated for memory-test purposes, that is, the memory-test switching-signal BITOR pin 3, the memory-test ORIN input pin 3 and the memory-test output OROUT pin 3. The number of pins dedicated for memory-test purposes does not depend on the bit count of the logic IC. In addition, since the memory test is carried out by compression of bits using the data compressing circuit 7, the length of the time it takes to complete the memory test is short in comparison with a case in which each bit is tested.

It should be noted that the data compressing circuit 7 can be provided in the library of the memory (DRAM 1) or in an area of the logic circuit.

According to a logic IC having an embedded memory provided by the present invention, a memory test can be carried out by using a data compressing circuit which requires only three pins dedicated for memory-test purposes, that is, a memory-test switching-signal pin, a memory-test input pin and a memory-test output pin. The number of pins dedicated for memory-test purposes does not depend on the bit count of the logic IC. In addition, since the memory test is carried out by compression of bits using the data compressing circuit, the length of the time it takes to complete the memory test is short in comparison with a case in which each bit is tested.

What is claimed is:

1. A logic IC comprising:
   an embedded memory;
   a memory array;
   a memory testing input pin;
   a memory testing switching pin;
   a memory testing output pin;
   a plurality of selectors, each selector corresponding to an input bit of said embedded memory provided between a logic circuit and the input of said embedded memory, wherein each of said selectors receives a signal from said logic circuit and a signal from said memory test input pin for memory-test purposes and forwards either the signal from said logic circuit or the signal from said input pin for memory-test purposes to said embedded memory according to a switching signal supplied to said selector from said switching pin for memory-test purposes; and
   a memory test data compressing circuit for receiving a read-back signal outputted by said memory array and converting said read-back signal into an output signal through said output pin for memory-test purposes.

2. A logic IC including an embedded memory as set forth in claim 1, wherein said one-bit output signal is a judging signal that indicates whether a plurality of bits in the read-back signal are all 0's or all 1's.

* * * * *